United States Patent [19]

Morishita et al.

[11] Patent Number: 5,428,230
[45] Date of Patent: Jun. 27, 1995

[54] REVERSE CONDUCTING GATE TURN-OFF THYRISTOR

[75] Inventors: Kazuhiro Morishita; Futoshi Tokunoh, both of Fukuoka, Japan

[73] Assignee: Mitsubishi Denki Kabushiki Kaisha, Tokyo, Japan

[21] Appl. No.: 216,980

[22] Filed: Mar. 24, 1994

[30] Foreign Application Priority Data

Mar. 25, 1993 [JP] Japan .................................. 5-066761
Mar. 22, 1994 [JP] Japan .................................. 6-050715

[51] Int. Cl.⁶ ...................... H01L 29/74; H01L 27/02
[52] U.S. Cl. ...................... 257/149; 257/121; 257/127; 257/138; 257/153
[58] Field of Search ............... 257/121, 126, 127, 138, 257/146, 147, 153

[56] References Cited

U.S. PATENT DOCUMENTS

| | | | |
|---|---|---|---|
| 4,150,391 | 4/1979 | Jaecklin | 357/39 |
| 4,791,470 | 12/1988 | Shinohe et al. | 357/38 |
| 5,281,847 | 1/1994 | Tokunoh | 257/149 |

FOREIGN PATENT DOCUMENTS

| | | | |
|---|---|---|---|
| 3521079 | 6/1985 | Germany . | |
| 56-40277 | 4/1981 | Japan | 257/138 |
| 60-74677 | 4/1985 | Japan . | |
| 62-57250 | 3/1987 | Japan . | |
| 1-253274 | 10/1989 | Japan | 257/153 |
| 2240964 | 9/1990 | Japan . | |
| 3174775 | 7/1991 | Japan . | |
| 594989 | 9/1977 | Switzerland . | |

*Primary Examiner*—Ngân V. Ngô
*Attorney, Agent, or Firm*—Leydig, Voit & Mayer

[57] ABSTRACT

A reverse conducting gate turn-off thyristor (RC-GTO) includes, in the same semiconductor body, a gate turn-off thyristor, a reverse current diode, and a semiconductor isolation region between the gate turn-off thyristor and the reverse current diode and having a first conductivity type semiconductor layer adjacent an anode electrode and spaced apart second conductivity type high-dopant-impurity-concentration regions opposite the anode electrode.

6 Claims, 5 Drawing Sheets

REVERSE CONDUCTING GATE TURN-OFF THYRISTOR

FIELD OF THE INVENTION

This invention relates to a reverse conducting gate turn-off thyristor (RC-GTO) structure in which a gate turn-off thyristor (GTO) and a reverse current diode (RCD) are located on the same substrate.

DESCRIPTION OF THE RELATED ART

A conventional reverse conducting gate turn-off thyristor will be described with reference to FIG. 6 which is a sectional view showing the essential part of a conventional reverse conducting gate turnoff thyristor.

In FIG. 6, a GTO section a includes an anode emitter layer ($P_E$ layer) 1, an anode base layer ($n_B$ layer) 2, a cathode base layer ($p_B$ layer) 3, and a cathode emitter layer ($n_E$ layer) 4. The anode base layer 2 is an anode short structure due to an anode emitter short-circuiting layer (n+layer) 5 having a high dopant impurity concentration.

In FIG. 6, the RCD section b includes an anode base layer ($p_b$ layer) 3' that is common to the cathode base layer 3 of the GTO section a, a cathode base layer ($n_B$ layer) 2' that forms a part of the same layer as the anode base layer 2 of the GTO section a, and an n+type cathode layer 6.

Further, in FIG. 6, numeral 7 indicates an anode electrode for both the anode of the GTO section a and the cathode of the RCD section b, numeral 8 indicates a gate electrode on the cathode base layer 3 of the GTO section a, numeral 9 indicates a cathode electrode on the cathode emitter layer 4 of the GTO section a, and numeral 10 indicates an anode electrode on the anode base layer 3' of the RCD section b. The cathode electrode 9 of the GTO section a and the anode electrode 10 of the RCD section b are kept in contact with each other through a pressure contact electrode plate (not shown) arranged on the electrodes 9 and 10 so that they are at the same electrical potential.

An isolation region c is located between the GTO section a and the RCD section b. An isolation groove 11 for electrically isolating the cathode base layer 3 of the GTO section a from the anode base layer 3' of the RCD section b is located in the isolation region c. Thus, due to the presence of the isolation groove 11, short-circuiting through the anode base layer 3' of the RCD section b, which occurs when a reverse bias voltage is applied between the gate electrode 8 and the cathode electrode 9 of the GTO section a, is prevented.

Conventionally, to electrically isolate the cathode base layer 3 of the GTO section a from the anode base layer 3' of the RCD section b, the isolation groove 11 has a broad width, thereby enhancing the isolation resistance (RGK) of the isolation region c. However, when the width of the isolation region 11 is broad, the isolation region has a p-layer 12 having a broad width so that the carrier injection efficiency of the central portion of the p-layer 12 is high which causes the multiplication effect of the central portion of the p-layer 12 to be greater than at the GTO section a, resulting in a marked reduction in withstand voltage.

As stated above, the conventional reverse conducting gate turn-off thyristor has a problem in that, when the isolation groove 11 is broad to electrically isolate the cathode base layer 3 of the GTO section a from the anode base layer 3' of the RCD section b, the multiplication effect of the central portion of the p-layer 12 of the isolation region c increases, resulting in a marked reduction in withstand voltage.

SUMMARY OF THE INVENTION

It is an object of this invention to provide a reverse conducting gate turn-off thyristor with a high withstand voltage and an isolation region with a broad width.

According to the present invention, there is provided a reverse conducting gate turn-of thyristor comprising a gate turn-off thyristor, a reverse current diode, an anode electrode for both the anode of the gate turn-off thyristor and the cathode of the reverse current diode, and an isolation region between the gate turn-off thyristor and the reverse current diode having a first conductivity type semiconductor layer on the anode-electrode side and second conductivity type high dopant impurity concentration sections independently formed in the first conductivity type semiconductor layer of the isolation region.

DESCRIPTION OF THE PREFERRED EMBODIMENTS

First Embodiment

Figure 1A:
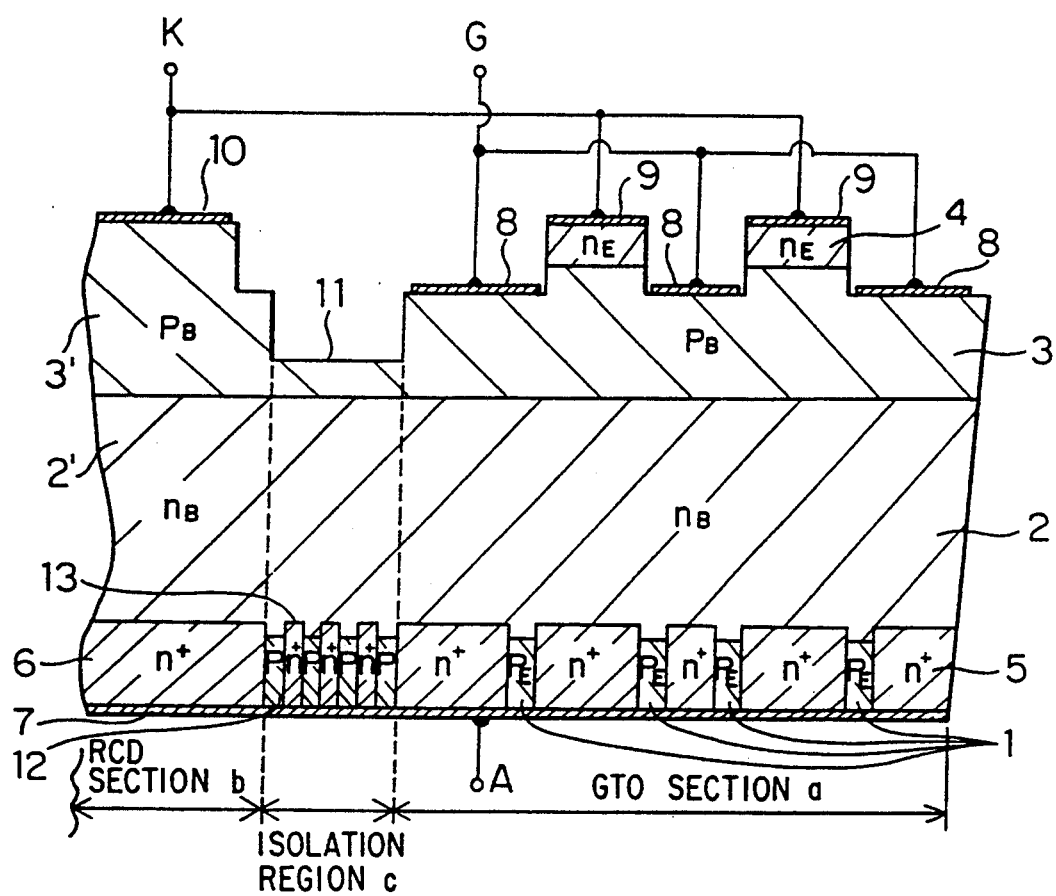
FIGS. 1A and 1B are a sectional view and a plan view, respectively, showing the essential part of a reverse conducting gate turn-off thyristor according to a first embodiment of this invention.
Figure 1B:
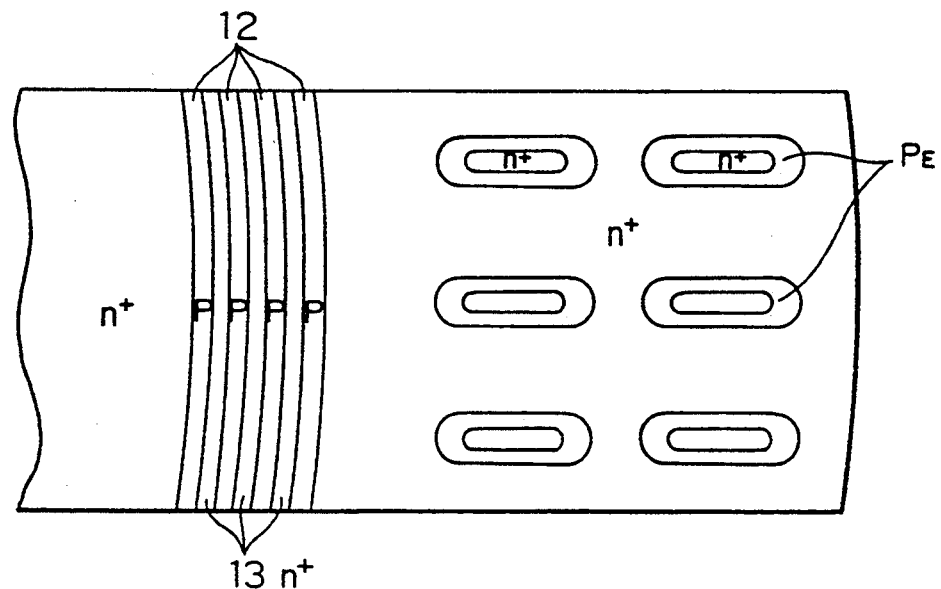
Figure 6:
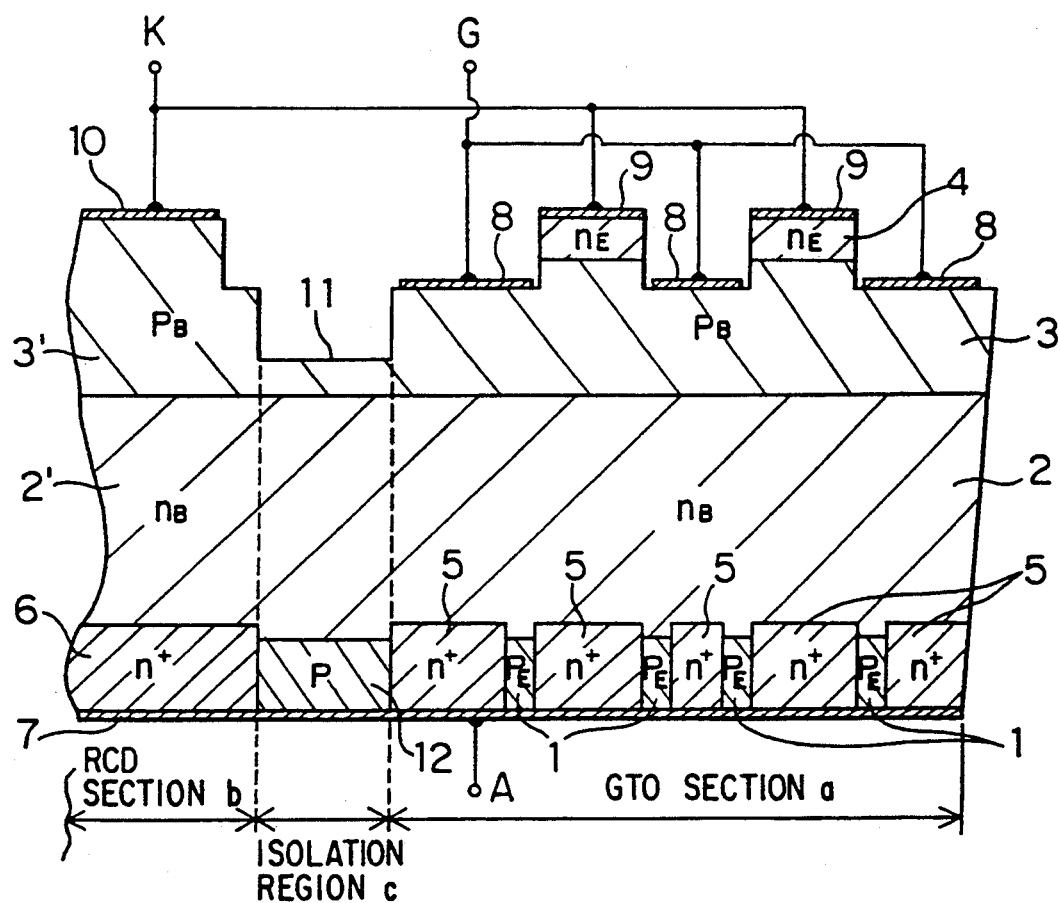
FIG. 6 is a sectional view showing part of a conventional reverse conducting gate turn-off thyristor.

A first embodiment of this invention will be described with reference to FIGS. 1A and 1B, which are a sectional view and a plan view, respectively, showing part of a reverse conducting gate turn-off thyristor. Those elements that correspond to elements of the conventional example shown in FIG. 6 are indicated by the same reference numerals and a detailed description of those elements is omitted. This embodiment differs from the conventional example in that high dopant impurity concentration n+sections 13, serving as a high dopant impurity concentration layer, are arranged at a constant interval, i.e., spacing, in the p-layer 12 in the lower section of the isolation region c that isolates the gate turn-off thyristor (GTO section a) from the reverse current diode (RCD section b).

Figure 2:
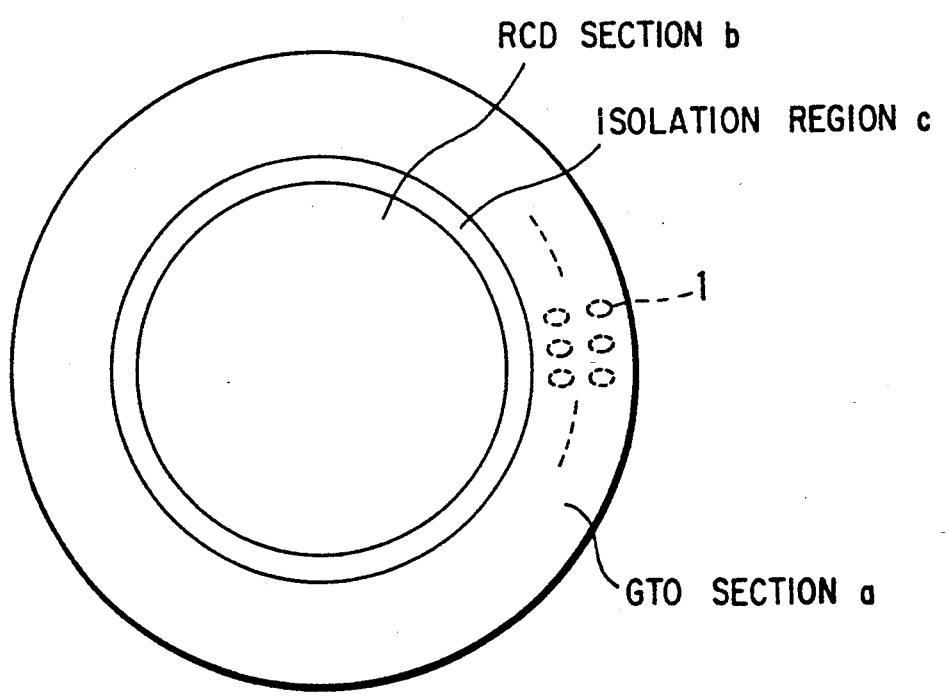
FIG. 2 is a plan view showing the overall construction of the first embodiment.
Figure 3:
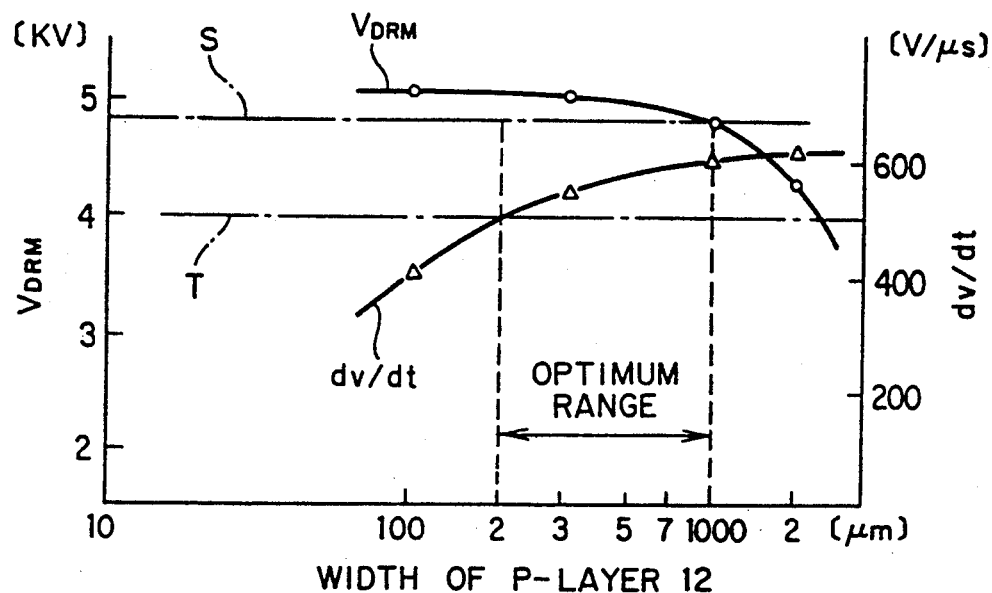
FIG. 3 is a diagram showing the relationship between the withstand voltage $V_{DRM}$ with respect to the width of the p-layer of the isolation region c and the value of dV/dt at the time of commutation failure.

As shown in FIG. 2, the GTO section a is an annular zone arranged around the RCD section b that has a circular configuration with the isolation region c intermediate GTO section a and RCD section b. The RCD section b, the isolation region c, and the GTO section a are concentric and the high concentration n+sections 13, shown in FIGS. 1A and 1B, are a plurality of concentric rings, concentric with the above-mentioned concentric elements and spaced apart at a constant interval.

In the isolation region c, which has a width of 3.9 mm, the n+ sections 13, each having a width of approximately 100 μm, have a pitch of 400 μm. The n+ sections 13, which are formed by diffusion simultaneously with the formation of the n+ layers 5 in the GTO section a, have a surface impurity concentration of $1.5 \times 10^{21}$ cm$^{-3}$ and a depth of 30 μm as measured from the anode electrode 7. The p-layer 12 of the isolation region c is divided into a plurality of parts by the n+ sections 13. Each such part has a width of approximately 300 μm, which is approximately 1.7 times as broad as the width, 180 μm, of each section of the $p_E$ layer 1 in the GTO section a. The p-layer 12 of the isolation region c and the $p_E$ layer 1 of the GTO section a have a depth of 25 μm as measured from the anode electrode 7.

In the reverse conducting gate turn-off thyristor of the first embodiment, a plurality of n+ sections 13 are spaced apart at a constant interval in the p-layer 12 of the isolation region c so that the width of each of the plurality of parts of the p-layer 12 in the isolation region c, defined by division by the n+ sections 13, is much narrower than the width of the p-layer in the conventional example. Therefore, the central portion of the p-layer 12 is only slightly subject to carrier multiplication so that a reduction in withstand voltage does not occur even if a high voltage is applied.

In an experiment, satisfactory results could be obtained when each part of the p-layer 12 had approximately the same width as that of each section of the anode emitter layer ($p_E$ layer) in the GTO section a. For example, in a 2000 A class reverse conducting gate turn-off thyristor having a construction similar to that shown in FIGS. 1A and 1B, the width of each part of the p-layer 12 of the isolation region c was varied in a range from 100 to 2000 μm while maintaining a width of 200 μm for each section of the $p_E$ layer 1 of the GTO section a. In this condition, the relationship between the withstand voltage $V_{DRM}$ with respect to the width of the p-layer 12 of the isolation region c and the value of dV/dt at the time of commutation failure was examined. The results showed that the optimum width of each part of the p-layer 12 is in the range from 200 to 1000 μm, within which both the withstand voltage $V_{DRM}$ and the value of dV/dt are not less than the design values of S and T, respectively.

Further, conventionally, formation of n-type sections in the p-layer 12 of the isolation region c would result in surplus carriers being injected into the cathode emitter layer ($n_E$ layer) 4 of the GTO section a at the time of reverse recovery of the diode, thereby causing breakthrough. In the first embodiment, however, there is no fear of such a problem since the area of the n+ sections 13 is very small.

As stated above, it is an object of the first embodiment of this invention to improve the withstand voltage of a reverse conducting gate turn-off thyristor without an increase in the number of manufacturing steps or deterioration in other characteristics of the thyristor. For this purpose, ring-like high dopant impurity concentration n+ sections 13 are formed at a constant interval in the p-layer 12 of the isolation region c between the gate turn-off thyristor and the reverse current diode.

Generally speaking, in a semiconductor device, the depletion layer greatly expands toward the $n_B$ layer when a reverse bias voltage is applied. This depletion layer expands to the proximity of the $p_E$ layer on the anode side and to the proximity of the p-layer in the isolation region with the result that carrier multiplication is liable to occur. In the first embodiment of the present invention, however, the high dopant impurity concentration n+ sections 13 are arranged in a split form in the p-layer of the isolation region, thereby restraining carrier multiplication and making it possible to obtain a high withstand voltage.

Figure 4:
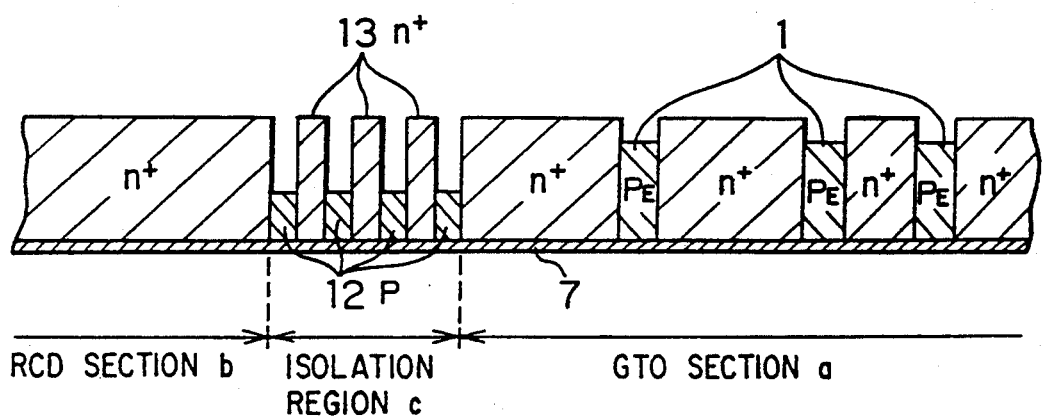
FIG. 4 is a sectional view showing a modification of the first embodiment.

When, as shown in FIG. 4, the depth of the p-layer 12 in the isolation region c as measured from the anode electrode 7 is smaller than the depth of the $p_E$ layer 1 in the GTO section a, it is possible to more effectively restrain carrier multiplication and obtain still higher withstand voltages.

Second Embodiment

Figure 5A:
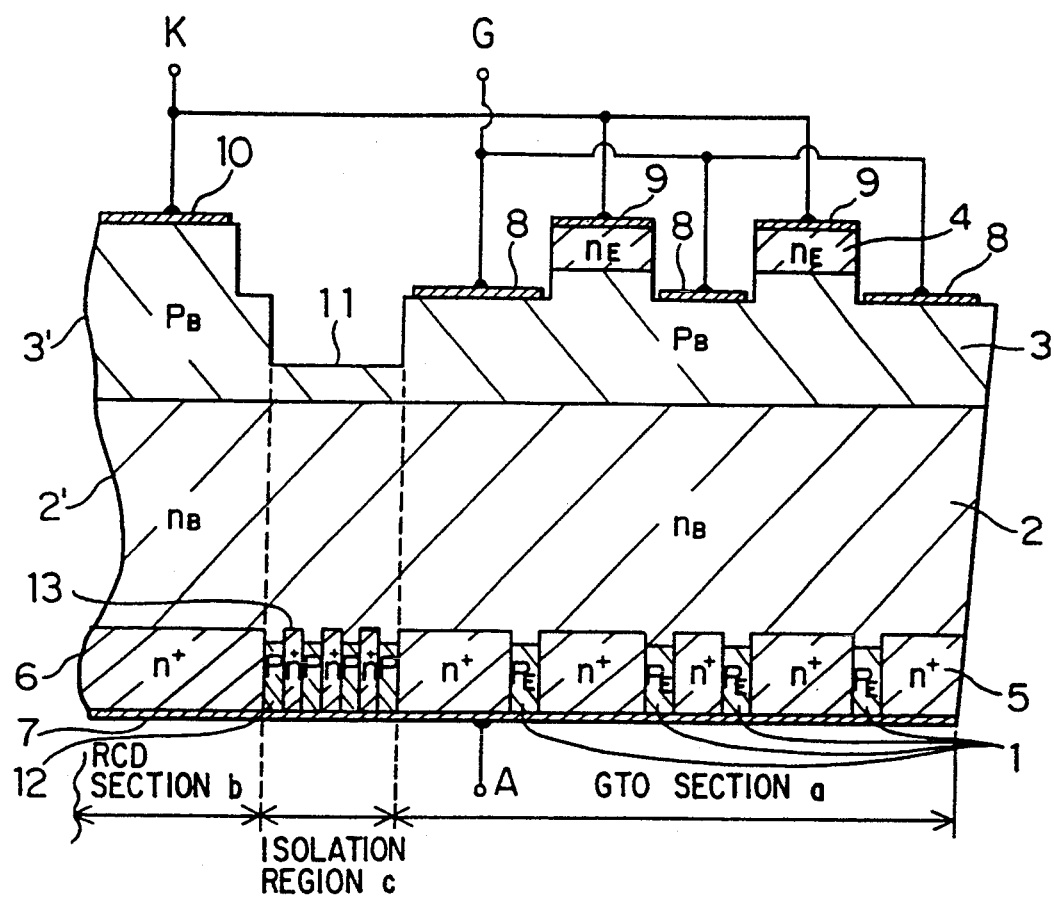
FIGS. 5A and 5B are a sectional view and a plan view, respectively, showing part of a reverse conducting gate turn-off thyristor according to a second embodiment of the invention.
Figure 5B:
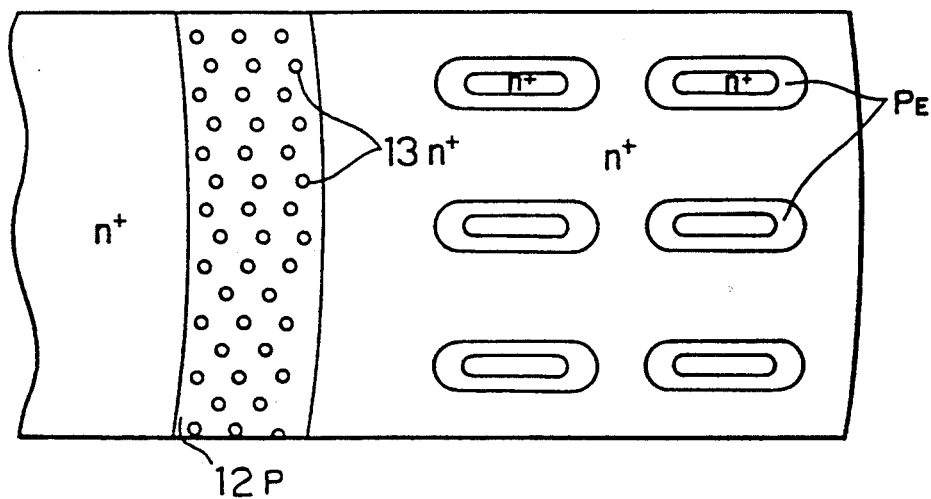

While in the first embodiment a plurality of annular n+ sections 13, each having a width of 100 μm, are formed at a pitch of 400 μm in the isolation region c having a width of 3.9 mm, it is possible, as shown in FIGS. 5A and 5B, to provide a plurality of dot-like n+ sections 13 in the p-layer 12 of the isolation region c. The n+ sections 13, each having a diameter of 100 μm, are arranged at an interval of 400 μm. The impurity concentration and diffusion depth of the n+ sections 13 in this embodiment are the same as those of the n+ sections 13 in the first embodiment.

The withstand voltage of the reverse conducting gate turn-off thyristor is determined by the width of the p-layer 12 of the isolation region c. However, the value of dV/dt at the time of commutation failure depends upon the area of the n+ sections 13 of the isolation region c. In the second embodiment, the n+ sections 13 in the isolation region c have a dot-like arrangement so that the area of the n+ sections 13 is reduced to approximately 0.03 to 1% as compared with the area of the n+ sections 13 in the first embodiment whereby the value of dV/dt is increased at the time of commutation failure.

Although in the first and second embodiments the GTO section a in the form of an annular zone is disposed around the circular RCD section b, as shown in FIG. 2, this arrangement should not be construed restrictively. It is also possible to arrange an annular RCD section b around a circular GTO section a.

What is claimed is:

1. A reverse conducting gate turn-off thyristor comprising:

a semiconductor body including a gate turn-off thyristor, a reverse current diode, and an isolation region located between said gate turn-off thyristor and said reverse current diode; and an anode electrode functioning as an anode of said gate turn-off thyristor and a cathode of said reverse current diode wherein said gate turn-off thyristor includes a plurality of anode emitter regions of a first conductivity type, each anode emitter region having a width and being disposed adjacent said anode electrode, said anode emitter region being separated by a high-dopant-impurity-concentration region of a second conductivity type, opposite the first conductivity type, and said isolation region located between said gate turn-off thyristor and said reverse current diode includes a second conductivity type region containing a first conductivity type semiconductor region adjacent said gate turn-off thyristor and said anode electrode and a plurality of spaced apart second conductivity type high-dopant-impurity-concentration regions within the first conductivity type region of said semiconductor isolation region, said second conductivity type high-dopant-impurity-concentration regions in said isolation region being spaced apart from each other by a distance approximately equal to the width of said anode emitter regions of said gate turn-off thyristor.

2. The thyristor according to claim 1 wherein said gate turn-off thyristor, said reverse current diode, and said isolation region are concentric regions in said semiconductor body.

3. The thyristor according to claim 2 wherein said second conductivity type high-dopant-impurity-concentration regions in said isolation region are contiguous annular regions arranged at equal intervals and concentric with said gate turn-off thyristor, said reverse current diode, and said isolation region.

4. The thyristor according to claim 1 wherein the first conductivity type regions of said isolation region have a depth measured from said anode electrode that is smaller than a depth of said anode emitter regions of said gate turn-off thyristor measured from said anode electrode.

5. The thyristor according to claim 2 wherein said second conductivity type high-dopant-impurity-concentration regions in said isolation region are mutually isolated regions arranged in a matrix pattern so that each mutually isolated region is equally spaced from the nearest mutually isolated regions.

6. The thyristor according to claim 1 wherein the first conductivity type layer is p-type and said second conductivity type high-dopant-impurity-concentration regions are n+ regions.

* * * * *